United States Patent [19]
Repinski

[11] Patent Number: 6,145,467
[45] Date of Patent: Nov. 14, 2000

[54] MAGNETIC FIELD INDICATOR

[75] Inventor: Gregory A. Repinski, Waukesha, Wis.

[73] Assignee: General Electric Company, Milwaukee, Wis.

[21] Appl. No.: 09/000,539

[22] Filed: Dec. 30, 1997

[51] Int. Cl.$^7$ .................. G01D 5/06; G01D 5/12
[52] U.S. Cl. .................. 116/204; 116/284; 116/303
[58] Field of Search .................. 116/204, 284, 116/298, 302, 305, 286, 287, 288, 303

[56] References Cited

U.S. PATENT DOCUMENTS

| | | | |
|---|---|---|---|
| 446,488 | 2/1891 | Waring | 116/284 |
| 2,372,002 | 3/1945 | Kelly | 324/140 R |
| 2,493,376 | 1/1950 | Zar | 116/204 |
| 2,637,618 | 5/1953 | Ray | 116/204 |
| 3,552,029 | 1/1971 | Wayne | 116/204 |
| 4,416,211 | 11/1983 | Hoffman | 116/204 |
| 4,854,061 | 8/1989 | Khoshkish | 40/495 |
| 4,890,572 | 1/1990 | Huang | 116/298 |

*Primary Examiner*—Diego Gutierrez
*Assistant Examiner*—Faye Francis
*Attorney, Agent, or Firm*—Quarles & Brady; Christian G. Cabou; Phyllis Y. Price

[57] ABSTRACT

A magnetic field indicator mounts to an MRI system to indicate the presence of the polarizing magnetic field. An indicator wheel is mounted to a frame and is rotatable between an energized orientation in which a red colored region is seen through a window and a de-energized orientation in which a green region is aligned with the window. A weight biases the indicator wheel in the de-energized orientation and a ferrous rod rotates the wheel to its energized orientation when the polarizing field is present.

7 Claims, 2 Drawing Sheets

MAGNETIC FIELD INDICATOR

The field of the invention is magnetic resonance imaging ("MRI"), and particularly, devices for detecting and indicating when the polarizing magnetic field on such systems is energized.

When a substance such as human tissue is subjected to a uniform magnetic field (polarizing field $B_0$), the individual magnetic moments of the spins in the tissue attempt to align with this polarizing field, but precess about it in random order at their characteristic Larmor Frequency. If the substance, or tissue, is subjected to a magnetic field (excitation field $B_1$) which is in the x-y plane and which is near the Larmor Frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The polarizing magnetic field $B_0$ used in commercial MRI systems is very strong. It may range from 0.06 to 3.0 Tesla, for example, which is a strength that can be destructive to magnetically sensitive devices such as watches, credit cards and pagers and dangerous for persons with ferrous implants such as pacemakers, aneurism clips, neurostimulators and shrapnel. In addition, approaching an energized MRI system with a ferrous object can attract the object with such force as to make it a dangerous projectile.

There are a number of technologies used to produce the polarizing magnetic field in MRI systems. Some employ permanent magnets which produce a fixed field, whereas others employ electromagnets which can be turned on and off. When the polarizing magnetic field is turned off on MRI systems using electromagnets, the hazards associated with strong magnetic fields are not present.

SUMMARY OF THE INVENTION

The present invention is an indicator that is mounted in the magnetic field produced by an MRI system and is operable to indicate if the magnetic field is present or not. More specifically, the indicator includes a stationary frame having a front wall, an indicator wheel rotatably mounted to the back of the front wall and weighted such that it rotates to a de-energized orientation when no magnetic field is present; a bar formed from a ferrous material and mounted to the indicator wheel in a location such that when a magnetic field is present the bar rotates the indicator wheel to an energized orientation, and a window is formed in the front wall to view indicia on the indicator wheel which indicate its orientation.

A general object of the invention is to provide an inexpensive and reliable means for indicating the presence of a strong magnetic field. The indicator is a passive device with only one moving part, the indicator wheel. The indicator wheel is normally biased in its de-energized position by the action of gravity. When a magnetic field is applied, the bar moves to align with the field, and in so doing, it rotates the wheel to its energized orientation.

DESCRIPTION OF THE PREFERRED EMBODIMENT

Figure 1:
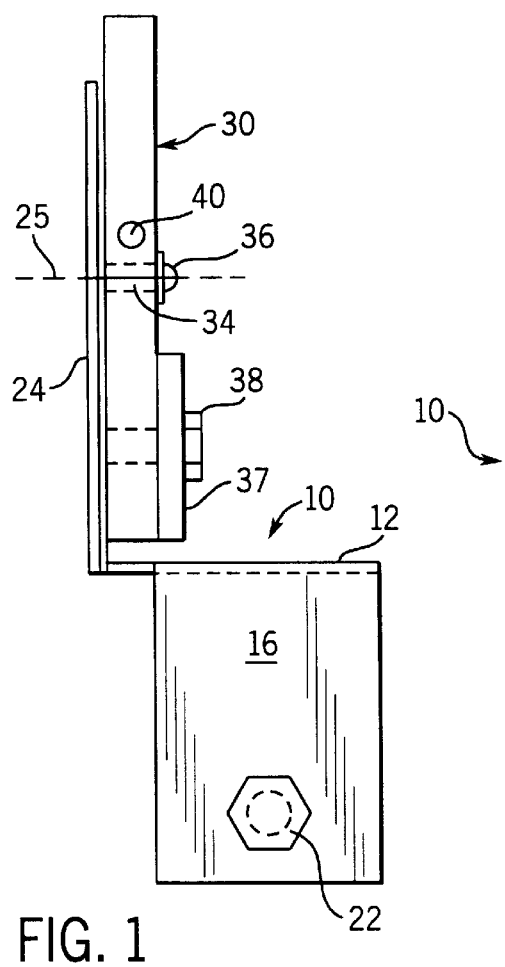
FIG. 1 is a side elevation view of the preferred embodiment of the indicator device according to the present invention.
Figure 2:
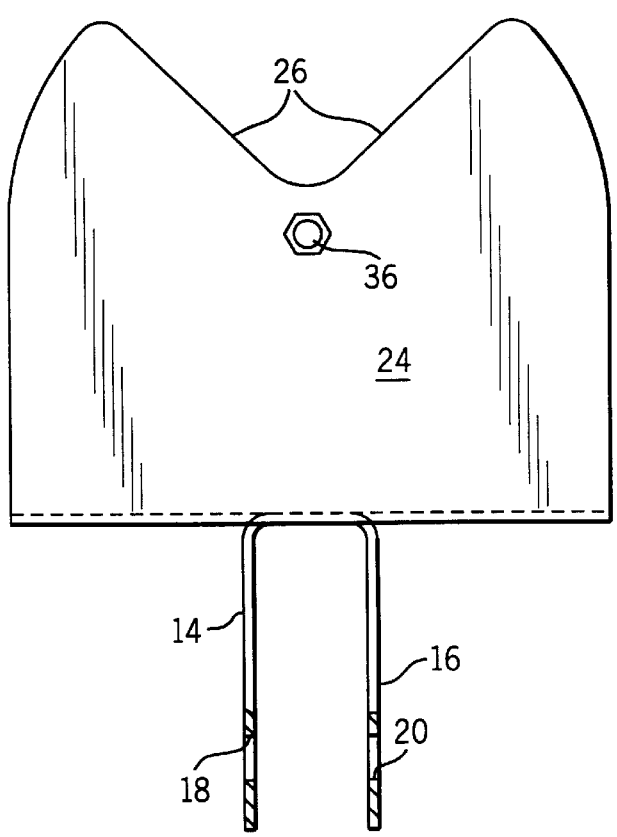
FIG. 2 is a front elevation view of the stationary frame which forms part of the indicator of FIG. 1.
Figure 3:
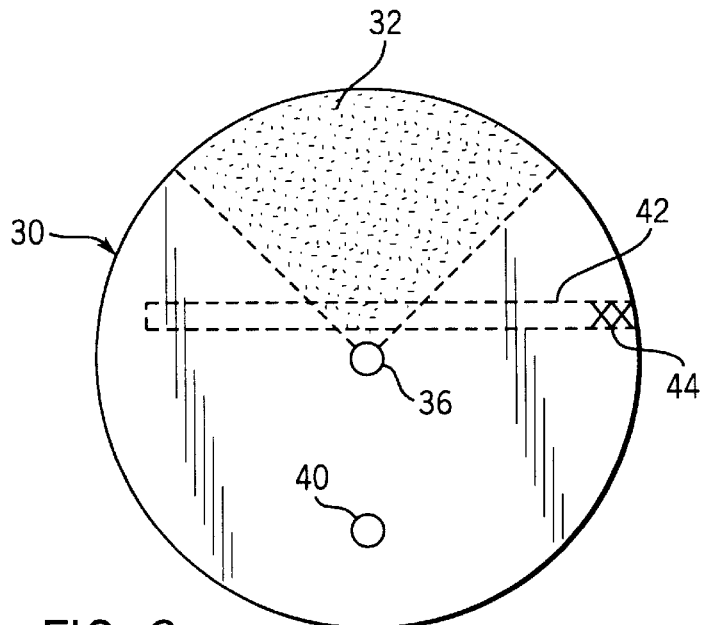
FIG. 3 is a front view of the indicator wheel which forms part of the indicator of FIG. 1.

Referring particularly to FIGS. 1–3, the indicator device includes a stationary frame 10 formed from sheet aluminum. The frame 10 has a base portion 12 having two downward extending tabs 14 and 16 that have aligned openings 18 and 20 for receiving a mounting bolt 22. This preferred embodiment provides a means for mounting the indicator to the lifting bracket on an MRI system.

The frame 10 also includes a front wall 24 which is integrally formed with and extends upward from the front edge of the base portion 12. As shown best in FIG. 2, the top of the front wall 24 is arched and a pie-shaped window 26 is formed therein by the removal of a 90° sector of this arch.

Referring particularly to FIGS. 1 and 3, an indicator wheel 30 is mounted to the front wall 24 for rotation about a horizontal axis 25. The indicator wheel 30 is made of a polymer sold under the trademark "LEXAN" and it is painted in two colors. A pie-shaped, 90° sector is painted green as indicated at 32, and the remainder of the wheel 30 is painted red. As will become apparent from the description below, the wheel 30 is disposed behind the front wall 24 and these colors provide indicia in the window 26 which indicate the orientation of the wheel 30.

The indicator wheel 30 is rotatably mounted to the front wall 24 by a standoff 34 that extends rearward from the front wall 24 and is received in a central opening 36 formed in the wheel 30. A brass screw 36 retains the wheel 30 in place.

As shown best in FIGS. 1 and 3, a brass weight 37 is fastened to the indicator wheel 30 by a brass screw 38. The screw 38 is received in a threaded opening 40 formed in the wheel 30 on the side opposite the green indicator 32. As a result, under normal ambient conditions, the wheel 30 is biased in a de-energized orientation in which the weight 37 rests below the central opening 36 and the green indicator 32 is positioned above. This "de-energized" orientation is shown schematically in FIG. 4, where the green indicator 32 is positioned in the window 26 to indicate that no strong magnetic field is present.

Figure 4:
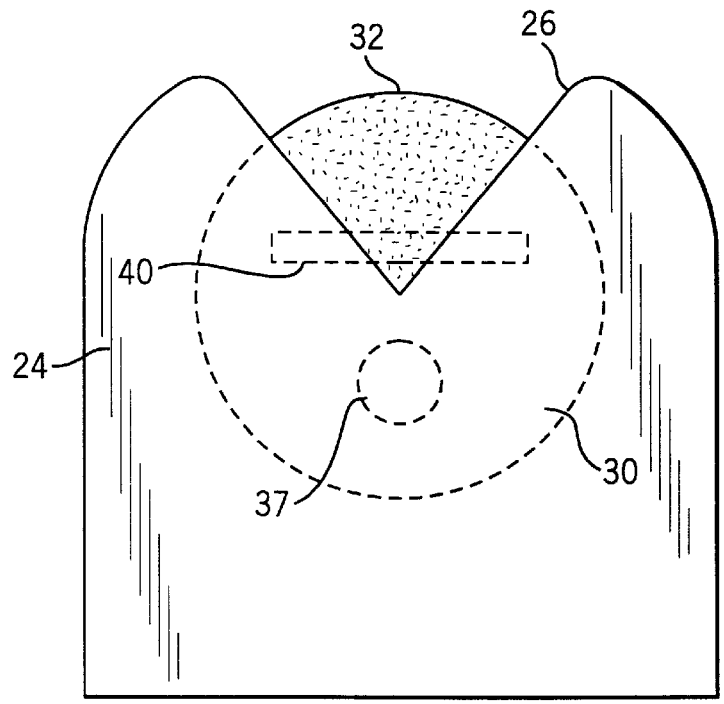
FIG. 4 is a schematic representation of the indicator device of FIG. 1 in its de-energized orientation.
Figure 5:
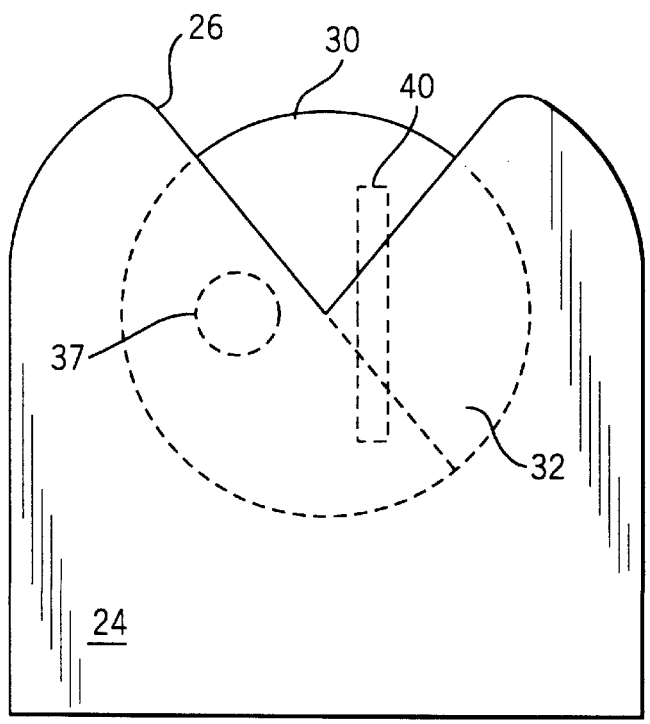
FIG. 5 is a schematic representation of the indicator device of FIG. 1 in its energized orientation in which a strong magnetic field is present.

Mounted in the indicator wheel 30 is a ferrous rod 40. A 0.25 inch hole 42 is bored in the wheel 30 on the side opposite the weight 37 and a 4 inch long steel rod 40 is inserted and fastened in place by epoxy indicated at 44. The ferrous rod 40 is horizontal when there is no magnetic field present, as shown in FIG. 4. However, when a strong magnetic field is present, the vertical component thereof rotates the ferrous rod 40 to a vertical orientation as shown in FIG. 5. In this "energized" orientation the green indicia 32 is rotated out of the window 26 such that only the red portion of the indicator wheel 30 is visible in the window 26.

When mounted adjacent to an MRI system, the presence of the polarizing magnetic field is indicated by the color appearing in the window 26. When no magnetic field is present, the indicator wheel is rotated to its de-energized orientation in which the green indicia 32 appears in the window 26. When the polarizing magnetic field is present, the rod 40 rotates the wheel 30 to its energized orientation in which the window 26 is filled with a red warning indicia.

What is claimed is:

1. A magnetic field indicator which comprises:

a frame having a front wall;

an indicator mounted to the frame and disposed behind the front wall;

means for non-magnetically biasing the indicator in a de-energized orientation in which a first indicia on the indicator is aligned in a window formed in the front wall; and a ferrous rod mounted to the indicator and responsive to an applied magnetic field to move the indicator to an energized orientation in which a second indicia on the indicator is aligned in said window.

2. The magnetic field indicator as recited in claim 1 in which the indicator is a rotatably mounted wheel.

3. The magnetic field indicator as recited in claim 2 in which the first indicia is a region of one color and the second indicia is another region of a different color.

4. The magnetic field indicator as recited in claim 1 in which the bias means is a weight made of non-magnetic material.

5. The magnetic field indicator as recited in claim 1 in which the indicator is a wheel mounted for rotation about an axis, the bias means is a weight made of non-magnetic material fastened to the wheel to one side of the axis and the ferrous rod is mounted to the wheel to the other side of the axis.

6. The magnetic field indicator as recited in claim 5 in which the ferrous rod is disposed in a plane perpendicular to the axis.

7. The magnetic field indicator as recited in claim 6 in which the ferrous rod is disposed in a hole formed in the wheel.

* * * * *